United States Patent [19]

Peck et al.

[11] Patent Number: 4,558,524

[45] Date of Patent: Dec. 17, 1985

[54] SINGLE VAPOR SYSTEM FOR SOLDERING, FUSING OR BRAZING

[75] Inventors: Douglas J. Peck, North Andover; Donald J. Spigarelli, Carlisle, both of Mass.

[73] Assignee: USM Corporation, Farmington, Conn.

[21] Appl. No.: 433,662

[22] Filed: Oct. 12, 1982

[51] Int. Cl.[4] .............................................. F26B 19/00
[52] U.S. Cl. ........................................ 34/78; 34/242; 55/446; 55/269; 134/104; 134/105; 228/242
[58] Field of Search .................... 34/12, 78, 27, 242; 55/71, 73, 269, 446; 118/61, 719, 729, 733; 134/46, 48, 49, 57 R, 104, 105, 107, 108, 109, 145, 175, 177, 200; 220/240, 242; 198/342, 586, 592; 432/2, 41, 152

[56] References Cited

U.S. PATENT DOCUMENTS

| | | | |
|---|---|---|---|
| 499,460 | 6/1893 | Hooper | 198/592 |
| 556,674 | 3/1896 | Hoberecht | 55/446 |
| 2,515,489 | 7/1950 | Borushko | 118/429 |
| 2,582,789 | 1/1952 | Morrison | 62/265 |
| 2,894,599 | 7/1959 | Leininger | 55/446 |
| 3,078,701 | 2/1963 | Rand | 134/115 R |
| 3,760,823 | 9/1973 | Ferguson | 134/143 |
| 3,866,307 | 2/1975 | Pfahl et al. | 228/34 |
| 3,904,102 | 9/1975 | Chu et al. | 34/27 |
| 3,947,240 | 3/1976 | Pfahl | 432/28 |
| 4,012,847 | 3/1977 | Rand | 34/75 |
| 4,022,371 | 5/1977 | Skarvinko et al. | 228/223 |
| 4,029,517 | 6/1977 | Rand | 134/105 |
| 4,032,033 | 6/1977 | Chu et al. | 134/75 |
| 4,055,217 | 10/1977 | Chu et al. | 228/180 R |
| 4,077,467 | 3/1978 | Spigarelli | 134/107 |
| 4,090,843 | 5/1978 | Chu et al. | 432/210 |
| 4,115,601 | 9/1978 | Ammann et al. | 228/180 R |
| 4,194,297 | 3/1980 | Pfahl | 34/26 |
| 4,264,299 | 4/1981 | Ammann et al. | 432/13 |
| 4,348,174 | 9/1982 | Spigarelli | 34/27 |
| 4,389,797 | 6/1983 | Spigarelli et al. | 34/73 |

FOREIGN PATENT DOCUMENTS

639972 12/1978 U.S.S.R. .............................. 134/143

OTHER PUBLICATIONS

Proceedings of the Technical Program, National Electronic Packaging and Production Conference, "Design Considerations for a Closed, Single Fluid Vapor Condensation Machine" March and Nannis, pp. 501-511 (1981).

*Primary Examiner*—Larry I. Schwartz
*Assistant Examiner*—David W. Westphal
*Attorney, Agent, or Firm*—Frances P. Craig

[57] ABSTRACT

A single vapor system for soldering, fusing, or brazing includes vertically disposed chambers which provide a draining and drying zone above a vapor processing zone. Draining occurs in the upper zone with no additional heat being added in vapor recovery. A sealing system is utilized which is actuated by the carrier elevator as an article-carrying basket is moved into and out of the zones. The sealing system includes a moveable top cover resting on the top of the article-carrying basket, with the top cover being left at the top of the draining and drying zone to seal the top of this zone when the basket is lowered to the bottom of this zone. A moveable bottom plate is raised by pulleys and weights, spring returns or other means to the bottom of the draining and drying zone such that the bottom plate seals the bottom of this zone, isolating the zones one from the other. Liquid drained from the article in the upper zone flows into a peripheral channel at the bottom plate to provide a liquid seal around the perimeter of the bottom plate. An unheated primary vapor recovery system and a combined system vent and unheated secondary recovery system are utilized for the draining and drying zone. In one embodiment, the carrier elevator includes basket-lowering straps or tapes which pass through cylindrical or square channels carried by the top plate, with the channels carrying slit and chamfered discs for prevention of vapor leakage at the points where the tapes pass through the top plate. In a completely automated embodiment, the carrier elevator is provided with an endless horizontal belt, with the belt being driven only when the carrier reaches the load/unload position.

19 Claims, 20 Drawing Figures

SINGLE VAPOR SYSTEM FOR SOLDERING, FUSING OR BRAZING

FIELD OF INVENTION

This invention relates to methods and apparatus for soldering, fusing, or brazing of articles and more particularly, to the utilization of a single hot saturated vapor for such purposes.

BACKGROUND OF THE INVENTION

As mentioned in U.S. Pat. No. 4,077,467, conventional methods for soldering, fusing, or brazing articles are generally not appropriate when a large number of such operations are to be performed rapidly, as in a mass production process. Thus, for example, when mass soldering printed circuit boards having many closely spaced connections, conventional soldering iron techniques are of little use when rapid soldering must be done. Several methods have been proposed in the past which utilize hot, saturated vapors. When these vapors come into contact with the article to be processed, they melt the solder or brazing material. One such method is described in U.S. Pat. No. 3,866,307 in which the vapors condense on the article and give up latent heat of vaporization to heat the article to the temperature needed for soldering, fusing, or brazing. To implement such a process an apparatus for performing the desired operation can be arranged to permit a single article or a batch of articles to be subjected to hot, saturated vapors in a suitable enclosure. The heat transfer liquid, for example, may be selected from a group of liquids known generically as fluorocarbons.

Systems presently in use utilize either a single vapor or a primary vapor and a secondary vapor blanket which prevents the loss of the primary vapor. In order to accomplish this and in accordance with the teaching of U.S. Pat. No. 3,904,102 and the aforementioned U.S. Pat. No. 3,866,307, the primary and secondary vapors are supplied from a mixture of primary and secondary liquids in the same reservoir. The secondary vapors boil off first at a lower temperature and fill the upper portion of the open enclosure. The more dense primary vapors which boil at a higher temperature fill the lower portion thereof. Problems in the regulation and maintenance of such multiple vapor systems are addressed in U.S. Pat. No. 4,077,467 and while such systems work satisfactory for most purposes, the maintenance of a multiple vapor system is oftentimes difficult and optimization of system operation is more difficult than utilizing a single vapor.

It will be appreciated that the vapors utilized are exceedingly costly and the recovery of such costly vapor is of paramount importance in the provision of an industrially useful process.

U.S. Patents relating to single or multiple vapor soldering, fusing, or brazing are Nos. 2,515,489; 3,866,307; 3,904,102; 3,947,240; 4,022,371; 4,032,033; 4,055,217; 4,077,467; 4,090,843; 4,115,601; 4,194,297, with vapor recovery systems being described in U.S. Pat. Nos. 2,582,789; 3,078,701; 4,012,847; and 4,029,517.

Most notably, U.S. Pat. No. 4,264,299 describes a two zone single vapor system in which the processed article is drained in the vapor processing zone. It is the primary object of this patent that drainage occurs in the vapor processing zone before the article is moved to an upper zone for evaporation and removal of any vaporized working fluid.

In accordance with the teachings of U.S. Pat. No. 4,264,299 and an article entitled "Design Considerations for a Closed, Single Fluid Vapor Condensation Machine", E. J. March and J. D. Nannis, pps. 501–511, published in Proceedings of the Technical Program, National Electronic Packaging and Production Conference, Anaheim, Calif., February, 1981, it was thought that draining in the vapor processing zone was necessary so that evaporation could efficiently take place in the upper zone due to the latent heat of the article. One reason draining was performed in the vapor processing zone was the supposition that a layer of condensed liquid on the article would interfere with the evaporation and recovery process in that the sensible heat of the article would be insufficient to cause a reevaporation of the condensed vapor on the article when the aritcle was moved to the upper zone. Not only was it thought that drainage would have to occur in the vapor processing zone, but also that vapor-laden gas in the upper zone would have to be heated prior to recirculation back to the upper zone in order to promote evaporation. It should be noted that in vapor soldering and degreasing machines made in accordance with the teachings of the 4,264,299 patent and aformentioned article, the vertical rise of the second zone was made high enough to assure complete drainage prior to re-evaporation in the upper zone.

SUMMARY OF THE INVENTION

The subject system is a single vapor system in which drainage occurs solely in an upper chamber comprising a draining and drying zone, whereas vapor processing occurs in a chamber immediately below the draining and drying zone, herein referred to as the vapor processing zone. A carrier elevator is provided for the transport of the article to be processed which moves through the zones on an article-carrying basket. The two zones are isolated, one from the other, by a sealing system including moveable plates which seal the top and bottom of the draining and drying zone. The sealing system is actuated by the carrier elevator as the article-carrying basket is moved into and out of the zones. In order to accomplish sealing in this manner, a moveable top cover in the form of a plate is provided which rests on top of the article-carrying basket. The article is loaded into the basket above the draining and drying zone. The basket is then lowered, with the cover being left at the top of the draining and drying zone, to seal the top of this zone when the basket is lowered to the bottom of this zone. The article-carrying basket is then lowered to the vapor processing zone for appropriate processing.

A moveable bottom plate biased into engagement with the bottom of the draining and drying zone is pushed downward by the bottom of the article-carrying basket into the vapor processing zone when the article is lowered into this zone. In one embodiment, the moveable bottom plate is raised by pulleys and weights, spring-loaded return tapes or other means to a sealing position at the bottom of the draining and drying zone, such that the bottom plate seals the bottom of this zone, thus isolating the zones one from the other.

After vapor treatment in the vapor processing zone, the basket is pulled upwardly via straps used as part of the carrier elevator such that the article is quickly moved to the draining and drying zone where draining and drying occurs. As the article and basket move into the draining and drying zone, the bottom plate rises with the basket, where it is left to seal the bottom of the draining and drying zone as the basket moves fully into this upper zone.

It is a feature of the subject sealing system that liquid drained from the article in the draining and drying zone, flows into a peripheral channel at the bottom plate to provide a liquid seal around the perimeter of the bottom plate. In order to accomplish the liquid seal, the walls of the draining and drying zone project downwardly into the peripheral channel. The peripheral edge of the channel projects upwardly to meet with a circumferential gasket fixed at the top portion of the chamber defining the vapor processing zone so as to provide a mechanical seal.

A vapor recovery system is utilized for the draining and drying zone in which an air/vapor aerosol mixture is pumped from the draining and drying zone to a recovery box, the output of which is dry air which is recirculated to the draining and drying zone. In one embodiment, the recovery box includes a chamber which is liquid-filled at the bottom. An inlet port is provided at the top at one end and a vertically depending baffle extends from the top of the box to a position beneath the fluid level. The fluid utilized is a liquid form of the vapor utilized in the system, and cooling coils are provided around sides of the recovery box to promote condensation of the vapor-aerosol mixture in the liquid. In one embodiment, horizontal staggered baffles are provided to the side of the vertically extending baffle opposite that adjacent the inlet port. An outlet port is located on top of the recovery box above the horizontally running baffles, and an overflow port provides for recovery of the recovered liquid to the system sump.

The vapor-laden aerosol enters the recovery box at, for instance, between 100° to 140° F., with the dry air leaving the recovery box at, for instance, 70° to 90° F. It has been found that no additional heat need be added to the recovery system in order for evaporation to occur in the draining and drying zone. In an alternative embodiment, overflow is provided to an additional recovery chamber integral to the recovery box. The additional recovery chamber has acid-absorbing crystals at the bottom thereof to acid-neutralize the recovered liquid. This additional chamber has a vertically depending baffle separating the inlet port and the outlet port and extends below the level of the crystals, with recovered liquid returned to the system sump.

A venting chamber is also provided for the draining and drying zone which is vented to atmosphere to minimize the effects of the pressure differentials caused by the raising and lowering of the article basket and the pressure disruptions caused by the sealing and unsealing provided by the aforementioned plates. It will be appreciated that when lowering the article-carrying basket, without venting, a partial vacuum may be established on the order of 15" $H_2O$. Likewise, when raising the article-carrying basket, overpressures on the order of 5" $H_2O$ may be established.

In order to minimize these partial vacuums and overpressures, the draining and drying zone is vented to atmosphere through a venting chamber or vent box which includes staggered baffles with thermally conductive mesh, such as brass wool, interspersed between the baffles. Between the inlet port to this chamber and the first baffle not only is the aforementioned mesh interposed, but also a vertically running series of cooling coils is interposed to cause vapor-laden air to condense into droplets which droplets are then recovered.

In summary, an unheated primary vapor recovery system and a combined system vent and unheated secondary recovery system are utilized for the draining and drying zone.

With respect to the carrier elevator, in one embodiment the carrier elevator includes basket-lowering straps or tapes which pass through cylinders or square channels carried by the top sealing plate. The cylinders or channels are provided with stacked discs or square pads. The discs or pads are slit and are chamfered downwardly. The straps or tapes pass through the slits which provides the seal between the straps and the top plate to prevent vapor leakage at the points where the tapes pass through the top plate. The chamfers in the bottom of the discs or pads at the slits serve to wipe any condensed vapor from the straps or tapes, thus preventing further drag out loss of valuable fluorocarbon processing fluid.

In a completely automated embodiment, a horizontal endless belt is utilized to move the article into and out of a load/unload position directly above the draining and drying chamber. The article carrier elevator is provided with an endless belt to support the article, in which the belt is driven only when the carrier reaches the load-/unload position. In a further embodiment, a loading belt is driven to move the article onto the belt carried by the carrier elevator. The belt associated with the carrier elevator moves downward with the carrier elevator as the article is moved downwardly through the upper zone and then into the vapor processing zone. During the time that the article is moved in a vertical direction, the drive for the belt associated with the carrier elevator is disengaged. When the processed article is moved up and out of the draining and drying chamber, the belt associated with the carrier elevator comes in contact with a drive roller which actuates the belt to move the article horizontally onto an unloading belt. In so doing, a completely automated system is provided in which endless belts are utilized to move the article to be processed to a position where it may be lowered into the aforementioned zones and removed after processing.

BRIEF DESCRIPTION OF THE DRAWINGS

These and other features of the subject invention will be better understood in connection with the detailed description taken in conjunction with drawings of which.

DETAILED DESCRIPTION

Figure 1A:
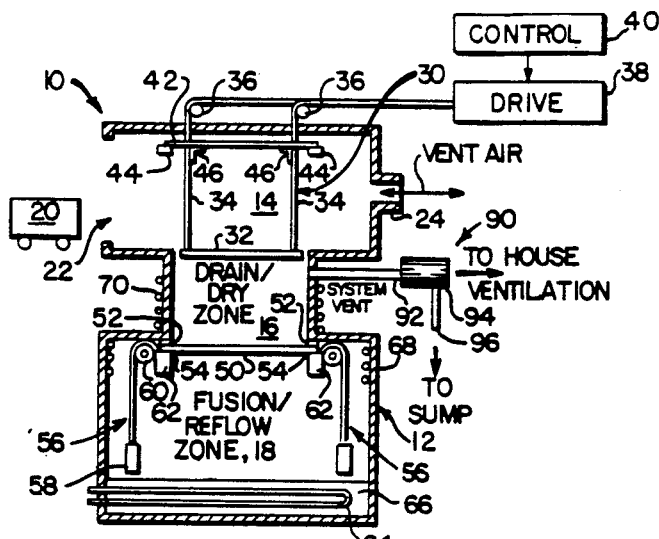
FIGS. 1A–1E are diagrammatic representations of the apparatus utilized in vapor processing showing the positions of the sealing plates and the article, as well as the carrier elevator, during article loading, article lowering trhough the draining and drying zone into the vapor processing zone, the position of the article during vapor processing, and the movement of the article into the draining and drying zone.

In order to provide for efficient processing of articles and referring now to FIGS. 1A-1E, a single vapor processing unit 10 includes a housing 12 which has chambers which define an article introduction zone 14, a drain/dry zone 16, and a fusion/reflow zone 18 which corresponds to the vapor processing zone mentioned above. An article 20 to be processed is transported through an opening 22 in housing 12, with the article introduction zone having a vent port 24 which is vented to atmosphere for the purpose of expelling any residual vapor.

A carrier elevator generally designated by reference character 30 includes a bottom tray, support or basket 32 which is moved into and out of zones 14, 16, and 18 via cables, tapes, strands, or chains 34 which are attached to basket 32. As diagrammatically shown, these tapes pass through housing 12 and around pulleys 36 to drive unit 38 under control of a control unit 40.

The drain/dry zone and the fusion/reflow zone are provided with a sealing system comprising a moveable cover 42 in the form of a plate having an annular seal 44. Cover 42 is supported a fixed distance above basket 32 by supports 46 which, as illustrated, are mounted to cover 42. It will be appreciated cover 42 may be supported a predetermined distance above basket 32 in a number of ways. More specifically, supports can be provided which project upwardly from basket 32 to support cover 42. However, what is important is the the cover, while being supported at a predetermined distance above basket 32, be permitted to be left to seal the drain/dry zone as the basket 32 descends.

It will also be appreciated that cover 42 is a moveable plate in that it is moved from a position in the article introduction zone to a piston on top of the drain/dry zone where it is left as basket 32 descends to the bottom of the drain/dry zone.

A bottom plate 50 is biased into position against the bottom 52 of drain/dry zone 16 such that an annular seal 54 seals the bottom plate to the bottom of the drain/dry zone which, in the embodiment shown is the top of the fusion/reflow zone 18.

Bottom plate 50 is also moveable and is biased into engagement with the bottom of drain/dry zone 16 through the use of a weight and pulley system generally illustrated at 56 to include a weight 58, a pulley 60, and bottom spacers 62 which limit the downward travel of plate 50 as will be discussed.

The fusion/reflow zone 18 is provided with heating elements 64 which, when actuated, vaporize liquid in sump 66 to provide for the aforementioned vapor processing. Cooling coils 68 are provided at the top of the fusion/reflow zone 18 to condense the vapor on the sides of housing 12 from whence it flows back into sump 66. Drain/dry zone 16 is also provided with cooling coils, here illustrated at 70, to condense evaporated liquid which drains back to the annular seal 54 to maintain the liquid seal.

Figure 1B:
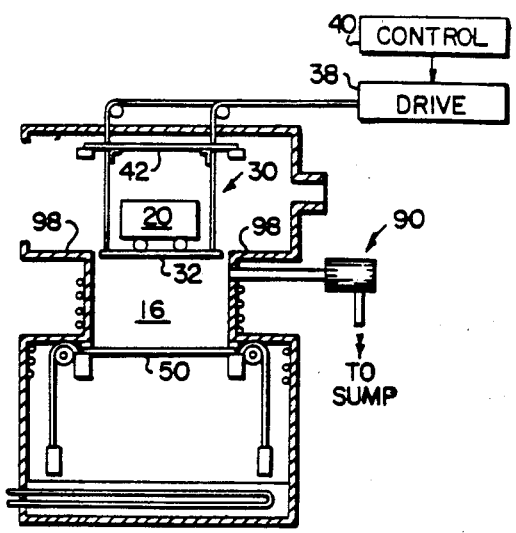
Figure 1C:
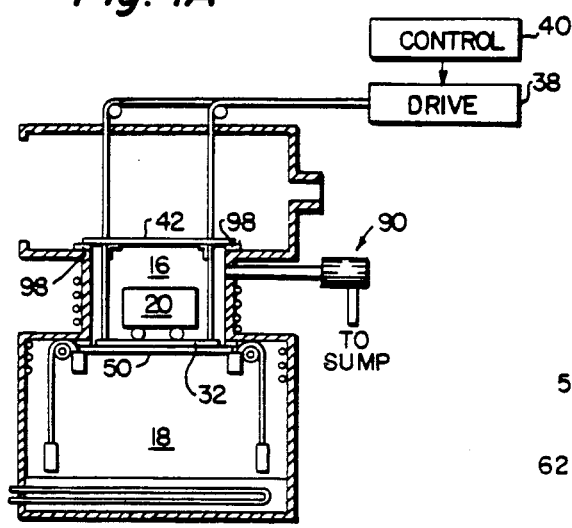
Figure 1D:
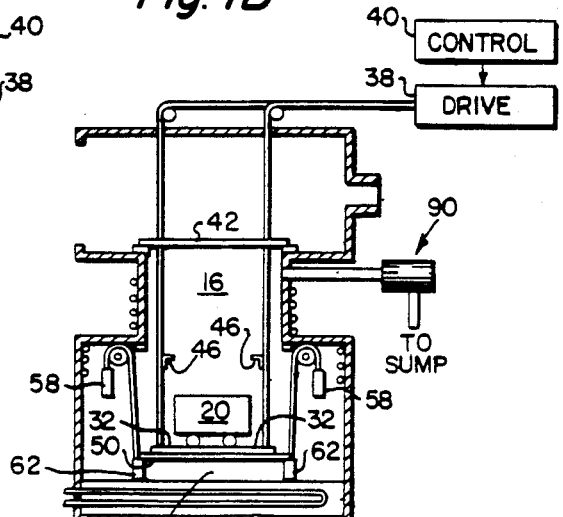
Figure 1E:
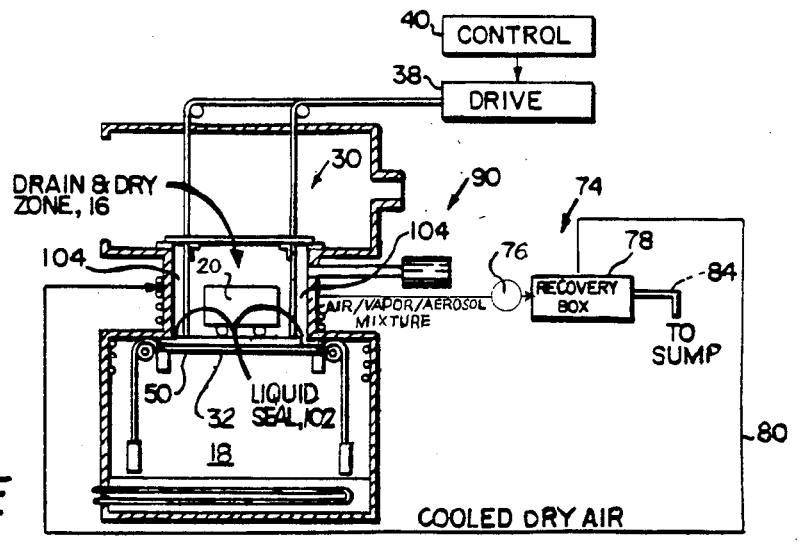

As illustrated in FIG. 1E, drain/dry zone 16 is provided with a recovery system generally indicated by reference character 74 which includes a recirculation loop including a blower 76, a recovery box 78, and a recirculation line 80 which recirculates cooled dry air back to drain/dry zone 16.

In operation, an air/vapor aerosol mixture is drawn from the drain/dry zone to the recovery box where aerosol/vapor is removed and the working fluid recovered via line 84 to the sump. Aside from the aforementioned condensation within zones 16 and 18, this is the primary recovery system for recovering the working fluid. The operation of the recovery loop will be discussed in more detail in connection with FIGS. 7 and 8.

Finally with respect to FIG. 1A, drain/dry zone 16 is provided with a venting system 90 coupled to the drain/dry zone via conduit 92, in which the venting system includes a secondary recovery chamber and vent box 94 which will be described more fully in connection with FIG. 6. It is a purpose of the system vent to alleviate pressure variations when the zones are sealed and unsealed with the movement of the carrier elevator. The vent box is vented to atmosphere and includes a line 96 which is connected to the sump for a secondary recovery of the working fluid.

With respect to the recovery of the working fluid, it will be appreciated that neither the primary vapor recovery system 74, nor the secondary vapor recovery system 90 involves providing additional heat to the system. It is a finding of this invention that neither recovery system requires the addition of heat in order to promote evaporation and drying within drain/dry zone 16.

Moreover, as will be seen, draining and drying occurs in the drain/dry zone, with the draining of the processed article providing liquid at the perimeter of bottom plate 50 which provides an exceptionally good liquid seal of the bottom plate to the bottom of the drain/dry zone.

In operation, article 20 is moved, as illustrated in FIG. 1B, onto basket 32. Control 40 then activates drive 38 to lower basket 32 into drain/dry zone 16, where, as illustrated in FIG. 1C, basket 32 comes to rest against bottom plate 50 at the same time that cover 42 comes to rest against top surface 98 of the chamber defining drain/dry zone 16. The spacing between cover 42 and the bottom of basket 32 is such that when the bottom of basket 32 meets plate 50, cover 42 engages top surface 98 to seal the entrance zone 16.

Referring to FIG. 1D, basket 32 is lowered into zone 18 and in so doing, cover 42 is left to seal the top of zone 16 as illustrated. This type of moveable cover can be considered a lost motion device in which cover 42 is left to seal zone 16. Note that the supports may be the tubes which also contain the seals. These tubes are mounted to cover 42.

Bottom plate 50 is moved downwardly by virtue of the contact of the bottom of basket 32, with the weight of article 20 plus the weight of the basket being sufficient to overcome the force provided by weights 58 such that plate 50 is pushed downwardly by virtue of its contact with basket 32. Plate 50 moves downwardly until such time as spacing members 62 come into contact with stops illustrated at 182 in FIG. 5C.

As illustrated in FIG. 1D, during vapor processing in which fusion or reflow is accomplished, zones 16 and 18 communicate one with the other, with cover 42 serving to seal both zones.

After vapor processing as illustrated in FIG. 1D, control 40 reverses drive 38, moving article 20 and elevator 30 back into drain/dry zone 16, with carrier elevator 30 being stopped at the point at which bottom plate 50 seals zone 16.

Due to the counterweighting system employed, plate 50 rises with the raising of basket 32 such that an effective seal is achieved at the bottom of zone 16. This seal is enhanced by a liquid seal 128 provided at the periphery of plate 50 as will be described more fully in connection with FIG. 2. The liquid for the liquid seal is that liquid which is drained from article 20 when article 20 resides in drain/dry zone 16. To this end, condensed liquid at the walls 104 of the chamber defining zone 16 drips into plate 50 and runs outwardly to its periphery where the liquid is utilized in the sealing process.

The provision of a liquid seal permits complete isolation of chambers 16 and 18, one from the other, so as to promote isolation of the hot vapor from the draining and cooling product. This seal further enhances recovery of working fluid by preventing transfer of additional material from zone 18 to zone 16. This seal is extremely important to contain vapor in zone 18 once cover 42 is opened and zone 16 is effectively exposed to the atmosphere outside.

When the article is in the drain/dry zone, a dry air recirculation and recovery system 74 is actuated to draw an air/vapor aerosol mixture into recovery box 78 at which point moisture and aerosol are removed from the mixture. The result is dry air which recirculated back to zone 16 where it is employed to remove additional vapor. In a typical situation, the air/vapor aerosol enters the recovery box at between 100° to 140° F. It has been found that the dry air which leaves the recovery box at, for instance, between 70° to 90° F. which, for most fluorocarbon vapors, does not impede the drying which occurs in the drain/dry zone. As mentioned hereinbefore, it has been found that no additional heat be added to the recovery system in order for evaporation to occur in the draining and drying zone. In addition to the obvious savings in terms of the heat which need not be supplied for the draining and drying process, it will be appreciated that by draining in the upper zone, the overall height of the apparatus can be reduced. Thus, in contrast to the prior art multi-zone approach in which the vertical height of the two zones is excessive, in the subject system the vertical height from the bottom of the fusion/reflow zone to the top of the drain/dry zone is on the order of 37″. Moreover, in prior art systems in which draining is to occur solely in the vapor processing zone, the article was required to move slowly in an upward direction after vapor processing, thereby increasing the cycling time and severely restricting the throughput. In the subject system with draining and drying occurring in the second zone, processing for a single batch takes place on the order of 4 minutes.

Figure 2:
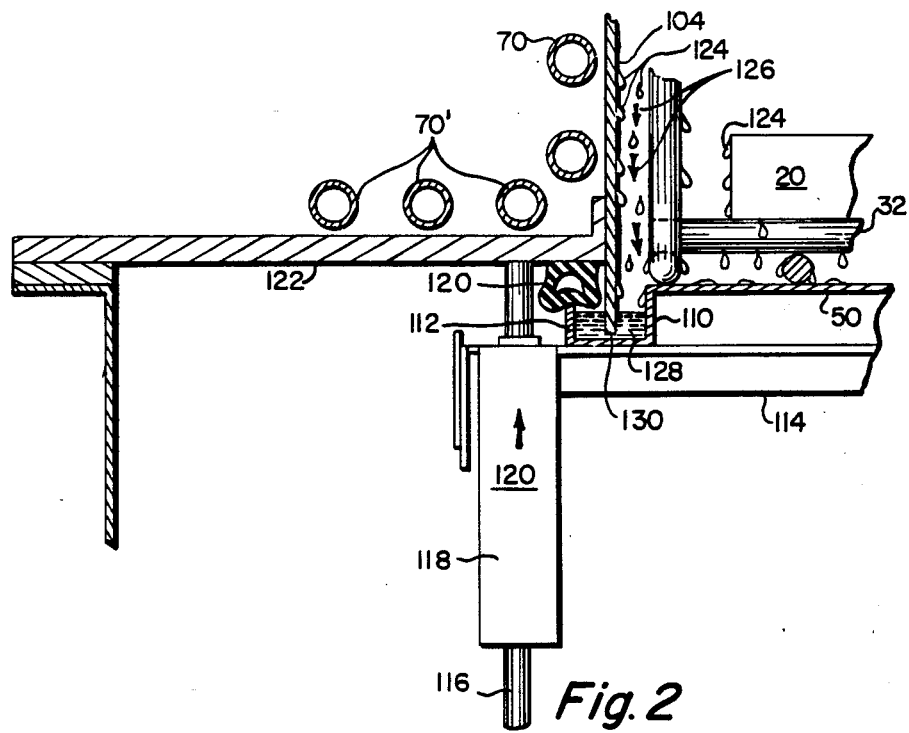
FIG. 2 is a diagrammatic and partial sectional view of a sealing system for the bottom plate of FIG. 1 involving the use of a circumferential liquid seal.

Referring now to FIG. 2 and more particularly to the liquid sealing system described hereinabove, plate 50 may be provided with a peripheral channel 110 which has an upstanding lip 112 as illustrated. In this embodiment, basket 32 rests on plate 50 supported by a support 114 which is guided via guide rails 116. Support 114 and a spacer-collar 118 are moved in the direction of arrow 120 by the aforementioned counterweight balancing system such that lip 112 is driven against an annular seal 120, which is an O-ring in one embodiment. This annular seal is carried at the bottom surface of a top plate 122 of the chamber defining fusion/reflow zone 18. As illustrated, cooling coils 70 of FIG. 1 are extended down to a position adjacent to plate 122. As illustrated, an alternative embodiment includes cooling coils 70′ which may be secured to plate 122.

In operation, condensed vapor droplets 124, both from article 20 and from wall 104 move downwardly as illustrated by arrows 126 so as to form a reservoir 128 of liquid in channel 110. It will be appreciated that wall 104 extends into channel 110 as illustrated at 130 to provide the mechanism for the liquid seal. The structure so created draws heat from liquid reservoir 128 to maintain this seal and prevents re-evaporation of liquid via heat from below. It will be appreciated that basket 32 can be in the form of an open mesh or grill which permits condensed liquid to drain into channel 110.

Figure 3:
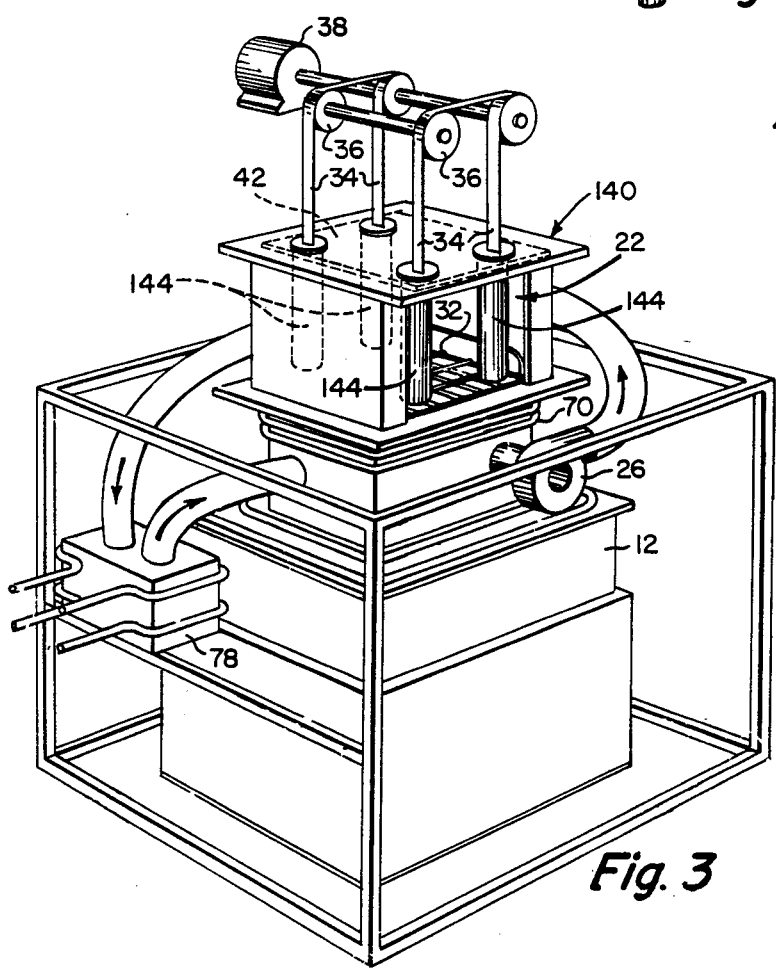
FIG. 3 is an isometric view of vapor processing apparatus illustrating a tape-driven carrier elevator.

Referring now to FIG. 3, an isometric view of one form of the apparatus of FIG. 1 is illustrated in which the reference characters refer to like elements as between FIGS. 1 and 3. As illustrated in FIG. 3, basket 32 may be in the form of a rack, grid, or mesh, and in general in hereinafter referred to as the article-carrying basket. The article-carrying basket is supported in a four point suspension via tapes 34 which pass through a top plate 140 of housing 12 and through cover 42, here shown in dashed outline.

Attached to cover 42 are cylinders or square channels 144 which come to rest against basket 32 so as to space cover 42 a predetermined distance from the bottom of basket 32. This distance is set such that when the basket is at the bottom of drain/dry zone 16, cover 42 rests on top of this zone.

Figure 4:
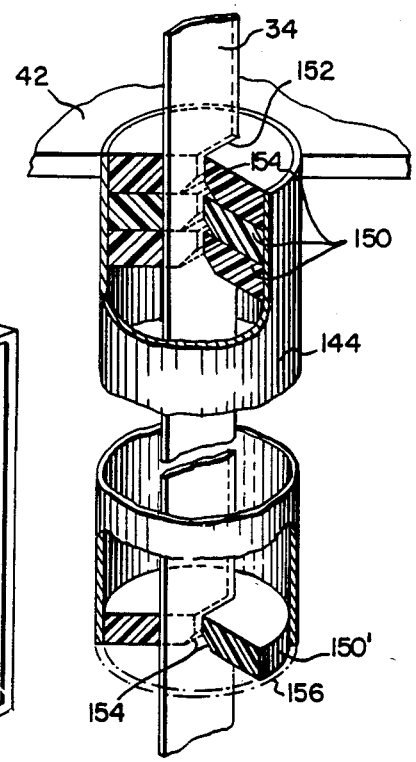
FIG. 4 is a partial sectional and diagrammatic illustration of the tape sealing system for the carrier elevator tapes of FIG. 3.

Tapes or straps 34 pass through cylinders 144 and are attached to the article-carrying basket, with the tapes being sealed to cover 42 via slotted and chamfered discs 150 illustrated in FIG. 4, through which tape 34 passes. Each disc includes a slot 152 chamfered at the bottom as illustrated at 154. A number of discs are positioned at the portion of cylinder 144 adjacent cover 42, and a single disc 150′ is positioned at the bottom of cylinder 144. The purpose of the lower disc is to prevent movement of the article-carrying basket, vis a vis bottom edge 156 of cylinder 144. Thus, as the carrier elevator moves the article-carrying basket downwardly, its position within the chambers is maintained by virtue of the friction fit between the bottom of the cylinders and the top surfaces of the article-carrying basket, with the friction fit being augmented by virtue of discs 150′ in respective cylinders which prevent the tape passing therethrough from moving in a lateral direction. Since, as will be seen in connection with FIGS. 5A–5D, cover 42 is maintained in lateral position within the housing defining the article introduction chamber, the cooperation of the sides of cover 42 with this chamber automatically positions cylinders 144 and thereby positions the article-carrying basket at least until such time as the article-carrying basket descends into the fusion/reflow zone. As the article-carrying basket pushes the bottom plate down, the position of the basket is maintained by the friction between the basket and the bottom plate, with the bottom plate being maintained in lateral positioning by virtue of guide rails 116 and collar 118.

The purpose of chamfers 154 is to provide a wiping action against the tape such that condensed working fluid is wiped from the tapes as the tapes are pulled upwardly by drive 38. While chamfering is most important with respect to bottom disc 150', chamfering of the remainder of the discs also provides for a wiping action. The cooperation of the tape with slits 152 provides a seal which prevents the escape of either vapor or liquid from the drain/dry zone.

Referring now to FIGS. 5A–5D, one embodiment of the sealing system is illustrated in which the cover 42 is carried by the carrier elevator, and more particularly is supported by cylinders 144 which are in contact with the article-carrying basket, here illustrated at 160, such that cover 42 is carried a predetermined distance above the bottom of the article-carrying basket. In these figures, like reference characters are used for like elements, vis a vis FIGS. 1–5.

Figure 5A:
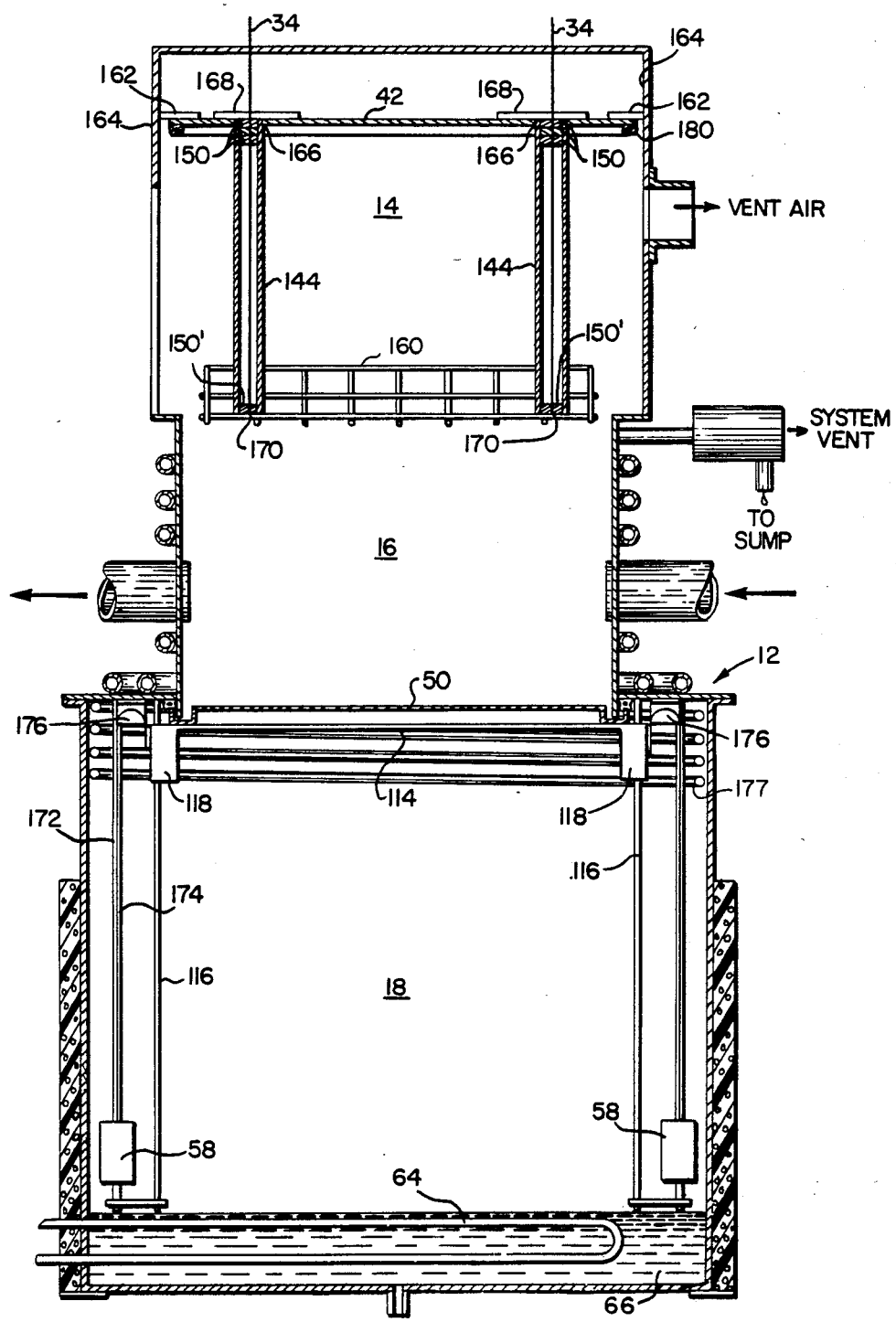
FIGS. 5A–5D are diagrammatic and sectional illustrations of the apparatus of FIG. 3, illustrating the descent of the article-carrying basket through the draining and drying zone into the vapor processing zone and back up into the draining and drying zone, also illustrating the moveable sealing plates of FIG. 1 and the support of the article-carrying basket by virtue of the tape drive system of FIG. 3, as well as illustrating the pulley and weight biasing system for the lower sealing plate.

Referring to FIG. 5A, cover 42 includes positioning stops 162 which communicate with walls 164 of the chamber defining zone 14 to position cylinders 144 laterally by virtue of the securing of cylinders 144 to cover 42. In one embodiment these cylinders are secured by welding top portions 166 of these cylinders to corresponding plates 168 located and welded to the top of cover 42. Discs 150 seal each of tapes 34 to its respective cylinder and thus to cover 42, whereas disc 150' restricts the position of the bottom 170 of tape 34. Note, the bottom of the tape is secured to the article basket. This in turn limits the lateral movement of the article-carrying basket.

Also as shown in FIG. 5A, weights 58 are illustrated as being constrained by guides 172, with a strand 174 attaching weight 58 to collar 118. In this embodiment strand 174 goes over a semi-cylindrical surface 176 and attaches to collar 118. Moreover, cooling coils 177 are provided in chamber 18 to promote vapor recovery.

Figure 5B:
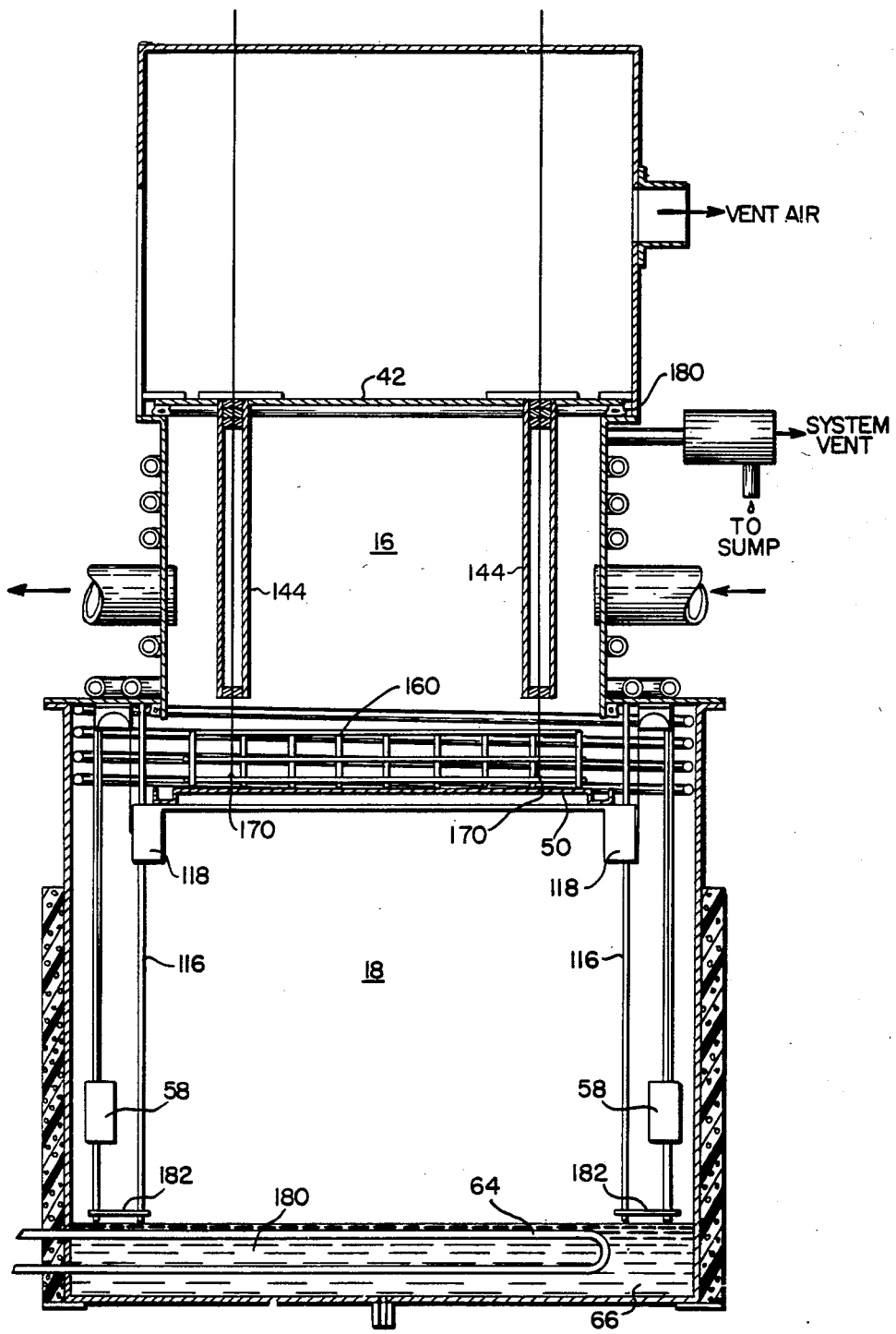
Figure 5C:
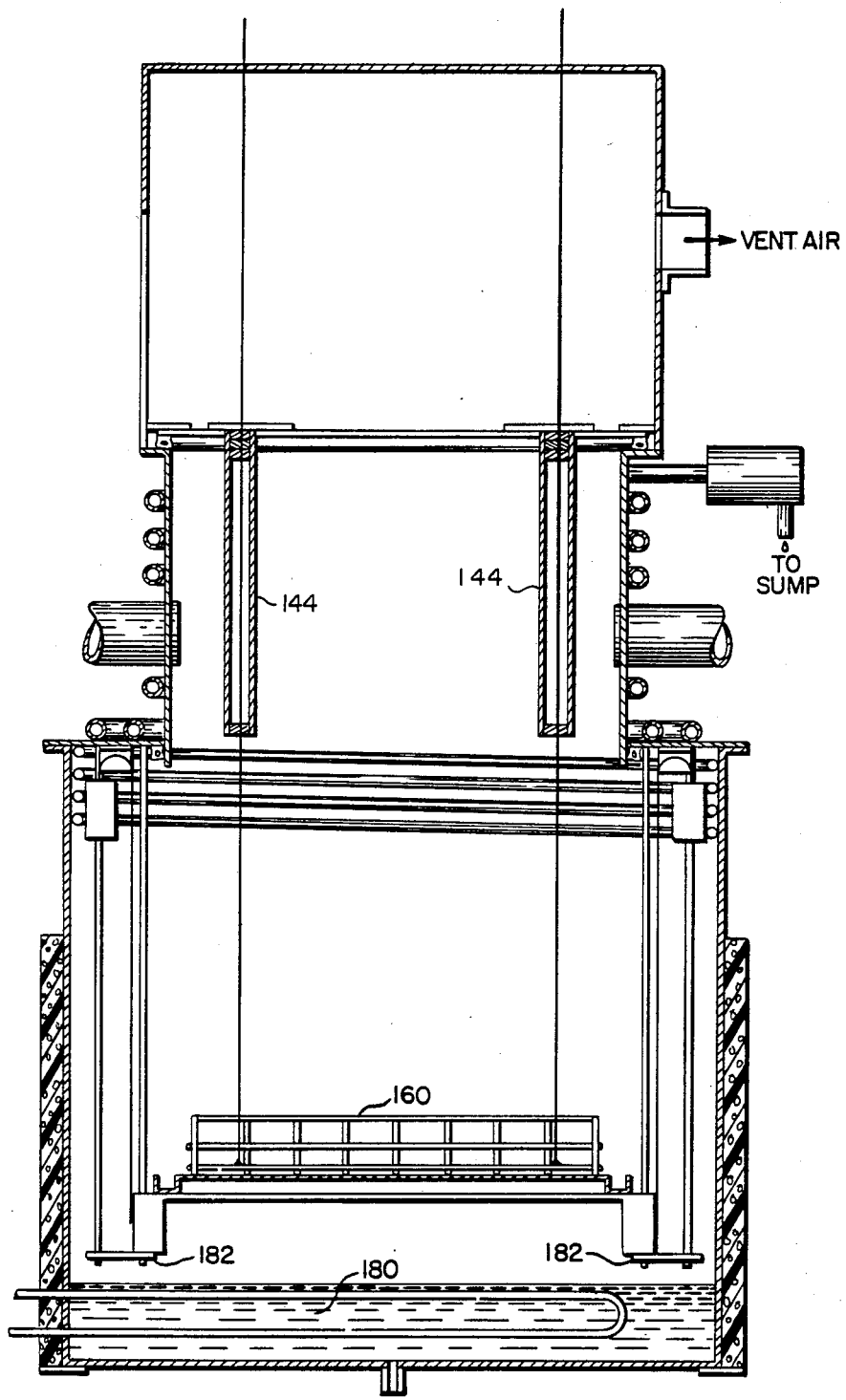

Referring to FIG. 5B, article-carrying basket 160 is moved into the fusion/reflow zone 18, with cover 42 having been left to seal the top portion of zone 16. This is accomplished by O-ring seal 180 which corresponds to seal 44 of FIG. 1. As can be seen, the article-carrying basket pushes down against plate 50, which in turn pushes down against support 114, with the position of the article-carrying basket being controlled in a lateral direction by virtue of the contact of plate 50 with basket 160. Here working fluid 180 is shown immersing heaters 64. Also, it will be appreciated that stops 182 limit the travel of collars 118 for spacing basket 160 from fluid 180 as illustrated in FIG. 5C.

Figure 5D:
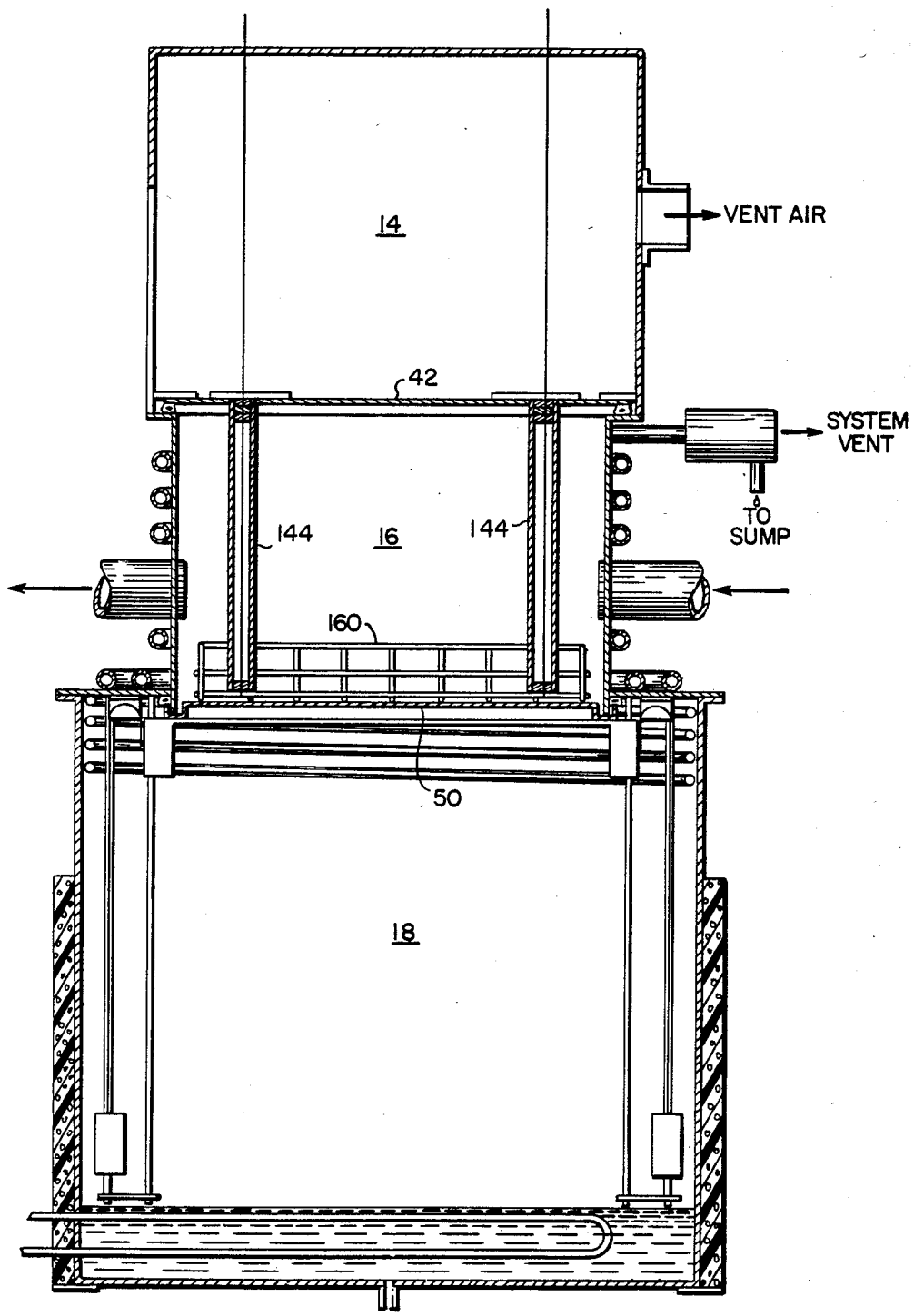

As shown in FIG. 5D, article-carrying basket 160 is again removed to zone 16 such that plate 50 provides the bottom seal and such that cover 42 provides the top seal. In this manner zone 16 is completely isolated, not only from zone 18, but also from the article introduction zone.

Figure 5E:
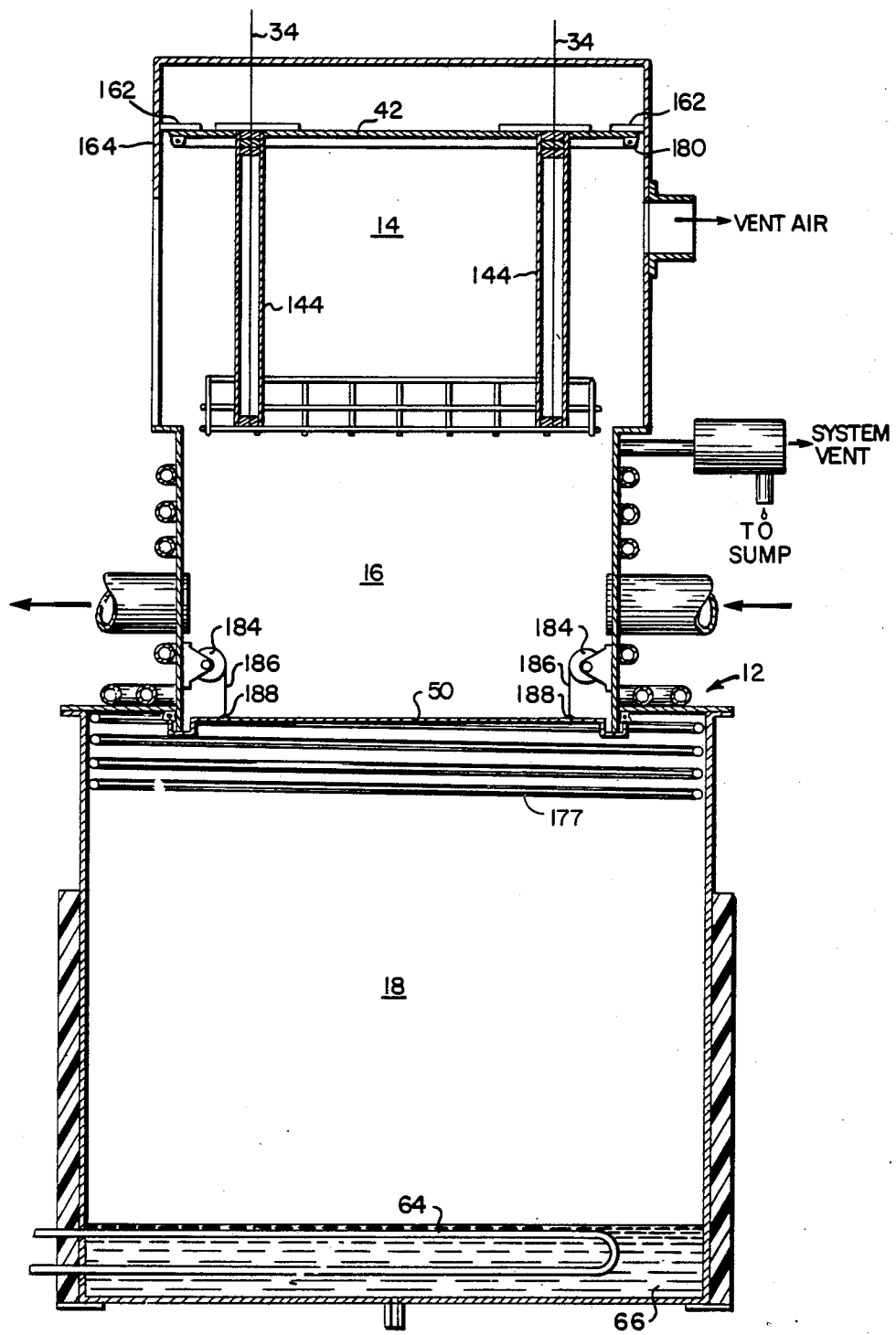
FIG. 5E is a diagrammatic and sectional illustration showing a spring-loaded pulley and tape return system for the lower sealing plate.

Referring now to FIG. 5E, the biasing and guides represented by the counterweighting system of FIGS. 5A–5D may be eliminated and replaced by a spring return system located in chamber 16 which includes four spring-biased pulleys 184 anchored to the vertical walls of this chamber. These pulleys provide constant tensioning forces and are commercially available as Ametek Model 8L12K42. Tapes 186 are wound on these pulleys and are joined to the corners of plate 50 at 188. This system provides the same upward biasing as the counterweight system of FIGS. 5A–5D, but without apparatus in the lower zone. This configuration facilitates maintenance since no access is required to the lower zone.

Figure 6:
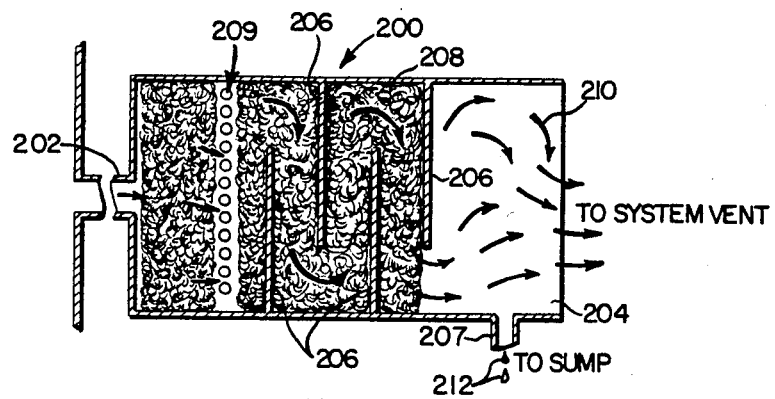
FIG. 6 is a diagrammatic and sectional illustration of the system vent for the apparatus illustrated in FIGS. 1, 3, and 5.

Referring now to FIG. 6, the system vent is illustrated by a vent box housing 200 which includes an inlet port 202, an open outlet 204 vent to atmosphere, and a recovery outlet 207 as illustrated. Housing 200 is provided with alternating vertically disposed baffles 206, with brass wool or other thermally conductive mesh or material 208 extending not only between the baffles, but also between the left hand baffle and port 202. Between the baffles and the port 202 is positioned a vertically disposed series of cooling coils 209 which provide for the condensing of vapor into droplets. The air flow is as illustrated by arrows 210 during pressure recovery of fusion/reflow zone 18, with secondary vapor recovery illustrated by droplets 212 from outlet 207.

In operation, since the system vent is vented to atmosphere, any overpressures are transmitted through housing 200 to the atmosphere. Likewise, any partial vacuums associated with the movement of the carrier elevator and associated apparatus are relieved by virtue of the inflow of air towards port 202. The practical significance of the venting and vapor recovery system is to eliminate the requirement for high strength, pressure vessel-type construction of zones 16 and 18 because of inherent "oil canning"; to lengthen the life of seals and gaskets by reducing stress; and to eliminate potential safety hazards due to higher internal pressurization.

Figure 7:
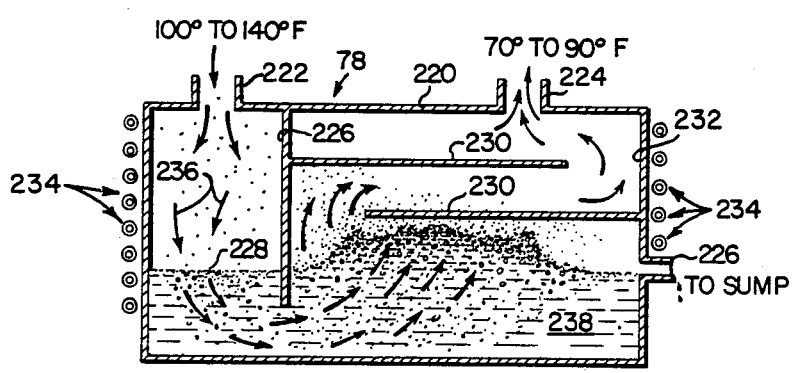
FIG. 7 is a digrammatic and sectional illustration of the vapor recovery box of FIG. 1.

Referring now to FIG. 7, the primary vapor recovery system incorporates the recovery box 78 to FIG. 1. This recovery box includes a housing 220 with an inlet port 222 and an outlet port 224 at the top of the housing. Adjacent to port 222 is a downwardly extending baffle 226 which extends below liquid level 228 made up of the working fluid. Staggered horizontally extending baffles 230 extend respectively from baffle 226 and wall 232 of housing 220, with housing 220 having an overflow port 226 which establishes the level of the fluid within the housing. The housing is surrounded by cooling coils 234 which provide for the condensing out of liquid from the aerosol mixture introduced at port 222. In one embodiment the aerosol mixture is introduced at a temperature of between 100° and 140° F. which flow, as illustrated by arrows 236, is through liquid 238. This causes a turbulent mixing action in which vapor droplets are entrained in the liquid, whereas dry air exits port 224 at between 70° and 90° in one embodiment. Vapor is entrained in liquid 238 during the process, such that dry air exits port 224.

Figure 8:
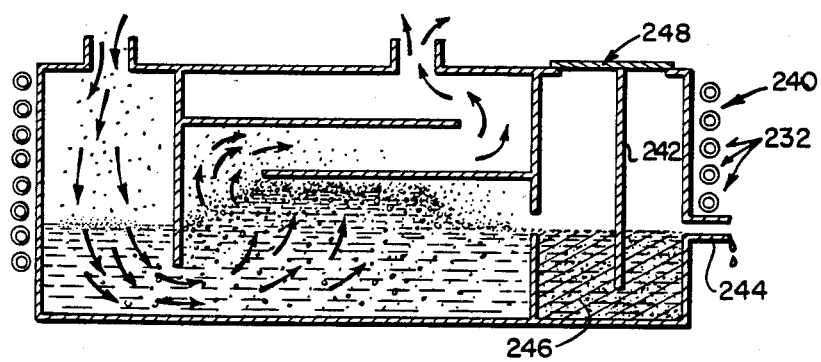
FIG. 8 is a diagrammatic illustration of an acid-neutralizing chamber integral to the vapor recovery box of FIG. 7; and, FIGS. 9A-9D are diagrammatic illustrations of the utilization of an endless belt conveying system in which one endless belt is mounted to the carrier elevator.

Referring now to FIG. 8 an integral acid-neutralizing chamber 240 may be placed adjacent overflow port 226, with chamber 240 having a vertically extending baffle 242 which extends into an acid-absorbing crystal mass 246. Cooling coils 232 are placed adjacent this acid-neutralizing chamber with an overflow port 244 being coupled to the sump. A removable cover 248 is provided for access to neutralizing crystals 246 which are changed on a regular basis. Such changeout minimizes accumulation of acid and resulting corrosion within the system.

Figure 9A:
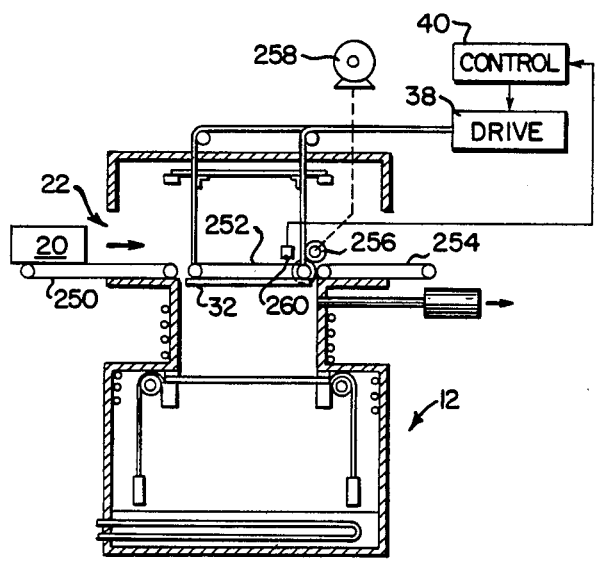
Figure 9B:
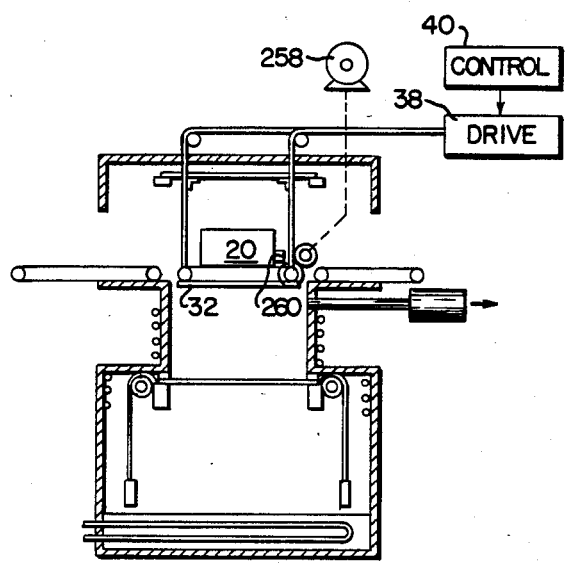
Figure 9C:
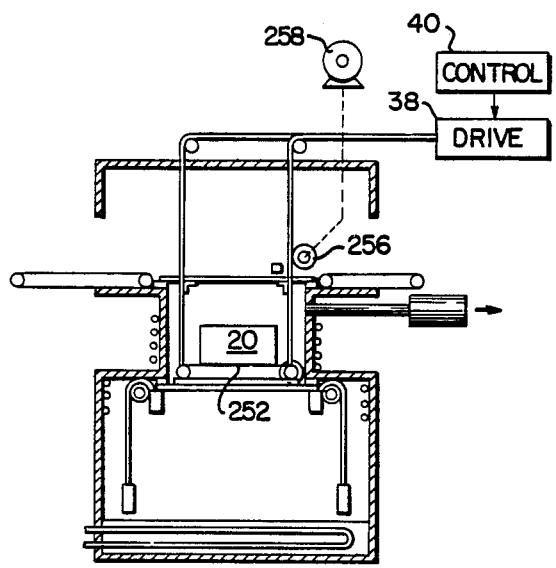
Figure 9D:
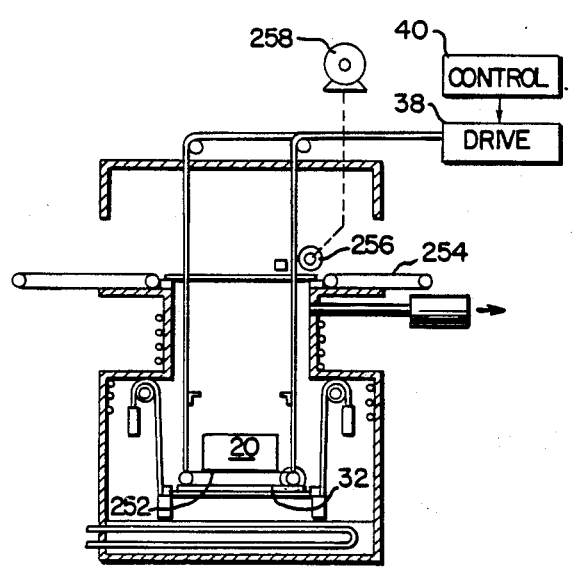

Referring now to FIGS. 9A–9D, a completely automated system for materials handling in which article 20 is transported onto basket 32 at a load/unload position includes a number of endless belts 250, 252, and 254. Belt 250 is located adjacent opening 22 of housing 12 and is configured to move article 20 to a position adjacent endless belt 252. Belt 250 is driven in any convenient conventional fashion such that article 20 is moved onto belt 252. Belt 252 is driven by a drive roll 256, which in turn is driven by a suitable motor or other means 258. Drive roll 256 is in continuous operation in one embodiment. When article 20 contacts switch 260, drive 38 is actuated to lower basket 32 from the load-/unload position through the various processing zones. As illustrated in FIG. 9C, when belt 252 is moved out of contact with drive roll 256 its motion stops, and the processing takes place as described hereinbefore. This processing is also depicted in FIG. 9D. When the processing is completed, basket 32 is moved upwardly by the carrier elevator until such time as belt 252 comes in contact with drive roll 256 at which point belt 252 is again driven to move article 20 onto belt 254. The drive for belt 254 and its control is conventional. In one embodiment, both belts 250 and 254 are driven continuously. In another embodiment, the actuation of belt 250 may be keyed to the operation of switch 260 such that belt 250 ceases operation when switch 260 is contacted. Moreover, belt 254 may be driven when belt 252 is driven for the second time upon the raising of basket 32 to the load/unload position.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A single vapor system for soldering, fusing or brazing comprising:
   at least two vertically disposed chambers, the first of said chambers being a draining and drying zone having a top and a bottom, the second of said chambers being a single vapor processing zone disposed below said first zone;
   article-carrying means having a bottom adapted to move vertically into and out of said zones;
   means for lowering said article-carrying means through said first zone and into said second zone, and for withdrawing said article-carrying means from both zones; and
   sealing means operative in response to lowering and withdrawing of said article-carrying means and including a vertically moveable top cover having spacer means for supporting said top cover at least a fixed predetermined distance above the bottom of said article-carrying means, said top cover being adapted to be left at the top of said first zone to seal the top of said first zone in response to the lowering of said article-carrying means toward the bottom of said first zone; a vertically moveable bottom plate; means for biasing said vertically moveable bottom plate to seal the bottom of said first zone when the bottom of said article-carrying means is above the bottom of said first zone; the biasing force of said biasing means being less than that exerted by said article-carrying means so that when said article-carrying means is lowered through the bottom of said first zone said cover seals the top of said first zone and said bottom of said article-carrying means abuts the moveable bottom plate which is moved downwardly to unseal the bottom of said first zone in response to the lowering of said article-carrying means through said first zone toward said second zone.

2. The system of claim 1 and further including means for both venting said draining and drying zone to the atmosphere and for recovering condensed vapor.

3. The system of claim 2 wherein said venting and recovering means includes a vessel having staggered baffles down part of the length thereof, one end of said vessel being completely open, said vessel being mounted horizontally and having a downwardly projecting exit port for the removal of condensed vapor, said venting and recovering means having a thermally conductive mesh between said baffles and condensing coils adjacent the other end of said vessel.

4. The system of claim 1 and further including a primary vapor recovery system coupled to said first zone which includes means for removing vapor-laden air from said first zone, means coupled to said removing means for removing and collecting liquid from said vapor-laden air, and means for supplying remaining dry unreheated air to said first zone.

5. The system of claim 4 wherein said primary vapor recovery system includes a horizontally disposed vapor recovery chamber having inlet and outlet ports at opposite ends of the top thereof, a liquid in the bottom of said vapor recovery chamber, a first vertically depending baffle at said inlet port extending from the top of said chamber to a position below the level of said liquid, horizontally running staggered baffles located above the level of said liquid beneath said outlet port to provide a serpentine air flow from the surface of said liquid to said outlet port and overflow outlet means at said liquid level.

6. The system of claim 5 and further including an auxiliary chamber communicating with said vapor recovery chamber at said overflow outlet means, said auxiliary chamber having a mass of neutralizing crystals at the bottom thereof, a vertically extending baffle from the top of said auxiliary chamber into said mass of crystals, and outlet port means at the level of said crystal mass.

7. The system of claim 1 wherein said moveable bottom plate includes a peripheral channel for retaining condensed vapor and wherein the bottom of said first zone includes means attached to the bottom of said first zone and cooperating with said peripheral channel for sealing said bottom plate to said first zone bottom at said peripheral channel.

8. The system of claim 7 wherein said bottom plate includes an upstanding annular ridge at the outside of said peripheral channel, and wherein said last mentioned sealing means includes an annular gasket positioned to coact with said upstanding annular ridge when said bottom plate is in its sealing position, and a downwardly projecting annular ridge adapted to project into said peripheral channel when said bottom plate is in its sealing position.

9. The system of claim 1 wherein said top cover spacer means includes tubes secured to and depending from said top cover and adapted to matingly engage said article-carrying means.

10. The system of claim 9 wherein said lowering means includes tapes passing through said tubes and anchored at one end thereof to said article-carrying means, said tubes including gasket means therewith for sealing the tape passing therethrough to the sidewalls of the corresponding tube.

11. The system of claim 10 wherein said gasket means includes a number of pads, each pad having a slit therein.

12. The system of claim 11 wherein said slits are chamfered.

13. The system of claim 1 wherein said biasing means includes pulley and weight biasing means including at least one pulley and one weight, a strand running from said weight and over said pulley to said bottom plate, and means for mounting said pulley and weight in said second zone.

14. The system of claim 1 wherein said biasing means includes a number of spring-loaded pulleys, means for mounting said pulleys in said first zone, and tapes wound on respective pulleys, each tape having a free end attached to a different part of said bottom plate.

15. The system of claim 1 further comprising means for controlling said withdrawing means such that said article is withdrawn from said second zone into said first zone immediately after vapor processing such that draining and drying occurs substantially solely in said first zone.

16. A single vapor system for soldering, fusing and brazing coprising:
   at least two vertically disposed chambers defining respectively a draining and drying zone and a single vapor processing zone immediately therebelow;
   means for moving an article to be processed into and out of said zones;
   means for sealing said zones so as to isolate one from the other during the time when said article is in said draining and drying zone and for providing communication between said zones during the time said article is in the vapor processing zone;
   means for controlling said moving means such that said article is raised into said draining and drying zone immediately after vapor processing such that draining and drying occurs substantially solely in said draining and drying zone; and
   means associated with said draining and drying zone chamber for condensing vapor in said draining and drying zone such that said condensed vapor drains to said sealing means to maintain a liquid seal at said sealing means during the time said zones are isolated one from the other.

17. The system of claim 16 wherein said sealing means includes means adapted to retain condensed vapor to provide a liquid seal between said zones during the time when said article is in said draining and drying zone.

18. A single vapor system for soldering, fusing and brazing comprising:
   at least two vertically disposed chambers defining respectively a draining and drying zone and a single vapor processing zone immediately therebelow;
   means for moving an article to be processed into and out of said zones;
   means for sealing said zones so as to isolate one from the other during the time when said article is in said draining and drying zone and for providing communication between said zones during the time said article is in the vapor processing zone; and
   means for controlling said moving means such that said article is raised into said draining and drying zone immediately after vapor processing such that draining and drying occurs substantially solely in said draining and drying zone; and
   wherein said article moving means includes at least one freewheeling horizontal conveyor belt adapted to carry said article and being moveable vertically into and out of said zones, means at the top of the upper zone adapted to contact said conveyor belt for actuating said conveyor belt when said belt is moved out of said upper zone and in contact therewith, said article moving means including means for moving said conveyor belt into contact with said actuating means.

19. A single vapor system for soldering, fusing and brazing comprising:
   at least two vertically disposed chambers defining respectively a draining and drying zone and a single vapor processing zone immediately therebelow;
   means for moving an article to be processed into and out of said zones;
   means for sealing said zones so as to isolate one from the other during the time when said article is in said draining and drying zone and for providing communication between said zones during the time said article is in the vapor processing zone; and
   means for controlling said moving means such that said article is raised into said draining and drying zone immediately after vapor processing such that draining and drying occurs substantially solely in said draining and drying zone; and
   wherein said sealing means comprises a moveable plate having a peripheral channel for retaining condensed vapor and means cooperating with said plate, said channel and said retained condensate to provide a liquid seal between said zones during the time when said article is in said draining and drying zone.

* * * * *